United States Patent
Takahashi

(10) Patent No.: US 6,803,614 B2
(45) Date of Patent: Oct. 12, 2004

(54) SOLID-STATE IMAGING APPARATUS AND CAMERA USING THE SAME APPARATUS

(75) Inventor: Hidekazu Takahashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/617,668

(22) Filed: Jul. 14, 2003

(65) Prior Publication Data

US 2004/0017503 A1 Jan. 29, 2004

(30) Foreign Application Priority Data

Jul. 16, 2002 (JP) ........................................ 2002-206829
Jun. 16, 2003 (JP) ........................................ 2003-170813

(51) Int. Cl.[7] ...................... H01L 31/062; H01L 31/113
(52) U.S. Cl. ........................ 257/292; 257/291; 257/294; 257/440; 257/463; 257/464
(58) Field of Search ................................ 257/233, 234, 257/291, 292, 294, 440, 463, 464

(56) References Cited

U.S. PATENT DOCUMENTS 5,302,997 A  *  4/1994  Cocca ........................... 396/99
6,452,634 B1  *  9/2002  Ishigami et al. ............. 348/322
2002/0047139 A1  *  4/2002  Wako et al. ................. 257/242

FOREIGN PATENT DOCUMENTS

EP        0 977 427 A2     2/2000
JP        2000-180706 A    6/2000

* cited by examiner

*Primary Examiner*—Ngân V. Ngô
(74) *Attorney, Agent, or Firm*—Fitzpatrick, Cella, Harper & Scinto

(57) ABSTRACT

An AE/AF solid-state imaging apparatus exhibiting suitable characteristics of spectral sensitivities of an AE sensor and an AF sensor respectively, is actualized, wherein visual sensitivity corrections filters of an optical system are reduced. In the solid-state imaging apparatus includes AF photodiode regions for auto-focusing and An AE photodiode region for executing a photometric process of a photographing region, are integrated on a same semiconductor substrate, characteristics of spectral sensitivities of the AF photodiode regions are different from a characteristic of the spectral sensitivity of the AE photodiode region. Desirably, a peak wavelength of each of the spectral sensitivity characteristics of the AF photodiode regions is positioned on a longer wavelength side than a peak wavelength of the AE photodiode region.

11 Claims, 8 Drawing Sheets

SOLID-STATE IMAGING APPARATUS AND CAMERA USING THE SAME APPARATUS

BACKGROUND OF THE INVENTION

1. Field of the Invention

The present invention relates generally to an AE/AF solid-state imaging apparatus, and more particularly to a passive type AE/AF solid-state imaging apparatus preferably used for a lens shutter compact camera. The present invention further relates to a camera using the AE/AF solid-state imaging apparatus.

2. Related Background Art

There has hitherto been a photometric/ranging solid-state imaging apparatus disclosed in U.S. Pat. No. 5,302,997 as an auto-focus (AF) sensor incorporating a photometric (AE: Auto-Exposure)function for a lens shutter compact camera. FIG. 7 shows a schematic plane layout of this solid-state imaging apparatus. Referring to FIG. 7, there are shown a photometric sensor array 30, a photometric center segment 2, photometric (AE) inner segments 34A to 34D, photometric outer segments 36A to 36D, photometric (AE) sensor arrays 40 and 42, pixels 441-n to 461-n, an Si semiconductor substrate 50, region sizes H and W of the photometric region, and a length D of base line.

The present sensor involves using two pieces of linear sensors such as the AF sensor array 40 and the AF sensor array 42 in order to perform ranging based on a detection of a phase difference. An AF sensitivity indicating a ranging accuracy can be given by:

$$AF\ sensitivity = D \times f/P$$

where P is a pixel pitch, and f is a focal length of an AF image forming lens. At the present, a solid-state imaging apparatus is actualized, wherein this AF sensitivity is on the order of 5000. If the pixel pitch is on the order of 10 μm and the lens focal length is several millimeters (mm), the length D of base line is 5 mm to 8 mm. Therefore, it follows that there exists an ineffective region between the AF sensor array (linear sensor) 40 and the AF sensor array (linear sensor) 42. As the AE sensor 30 is provided, however, the semiconductor substrate can be effectively utilized. Further, the AE sensor and the AF sensor are formed on one chip, thereby contributing to actualize both downsizing of the camera and a reduction in cost.

FIG. 8 is a sectional view of a structure of a region, taken along the line 8—8 in FIG. 7. For an explanatory convenience, however, the photodiodes of the AF sensor and the AE sensor are illustrated in a way that reduces the number of these photodiodes. Referring to FIG. 8, there are sown an N type Si substrate 71, an N type epitaxial layer 72, a P type well (PWL) 73, an $N^+$ type impurity diffusion region 74, a thin oxide film 75, a thick oxide film (LOCOS) defined as an element separation region, an AL wire 77, and an inter-layer insulation film 78. The PWL 73 and the $N^+$ type impurity diffusion region 74 form a PN-junction photodiode. When the light enters the photodiodes of the AE sensor region and of the AF sensor region, a photoelectric conversion occurs in the semiconductor, wherein couples of electron holes are generated. The holes (each indicated by a black circle ● in FIG. 8) among those are discharged to GND via the PWL 73, while the electrons (each indicted by a while circle ○ in FIG. 8) are accumulated in the floating $N^+$ type impurity diffusion region 74 in the AE sensor region and in the floating $N^+$ type impurity diffusion regions 74 in the AF sensor regions. The electrons gathered in these $N^+$ type impurity diffusion regions are converted in voltage by an unillustrated amplifier element, thereby generating AE signals and AF signals.

The AF system utilized generally in the camera is classified roughly into an active type and a passive type. The active type utilizes infrared reflection rays from an object by projecting the infrared-rays upon the object from an infrared-ray projection apparatus installed into the camera, and has such a characteristic that the auto-focusing (AF) can-be performed even in a completely dark place. While on the other hand, the active type has a weak point that an object located at a far distance beyond a reachable range of the infrared-rays can not be auto-focused (AF). By contrast, the passive type, unlike the active type, utilizes a luminance signal itself of the object and therefore has no limit of distance. The passive type has, however, a weak point that the object can not be auto-focused (AF) if a luminance of the object is low. To overcome this weak point of the passive type, at the present, there is actualized an AF auxiliary light system for projecting auxiliary light when the luminance is low. Human eyes sense the auxiliary light, if visible, to be glaring. It is therefore considered desirable that the auxiliary light be near infrared-rays. For attaining this, it is desirable that the characteristic of the spectral sensitivity of the AF sensor has a peak sensitivity in the near infrared-region. The majority of actual products, however, use not the near infrared-rays but red-color light as the auxiliary light, which contains a near infrared-component having a peak at 600 to 700 nm.

In the aforementioned example of the prior art, however, the photodiodes in the AF sensor regions and the photodiode in the AE sensor region are formed in the same well, and hence a problem is that the AF sensor and the AE sensor can not be set respectively to optimal spectral sensitivity characteristics. Especially the AE sensor, if sensitive to the infrared-rays, comes to have a large photometric error due to a difference between color temperatures, and hence visual sensitivity correction filters are required of an optical system. This design raises the costs for the camera and brings about an increase in size thereof and is therefore difficult to be adopted in a compact camera. Accordingly, in the conventional photometric/ranging solid-state imaging apparatus for the compact camera, the spectral sensitivity of the AF sensor had no alternative but to match with the AE sensor.

SUMMARY OF THE INVENTION

It is an objective of the present invention to actualize an AE/AF solid-state imaging apparatus in which an AE sensor and an AF sensor respectively have spectral sensitivity characteristics optimal to their objective functions. It is another objective of the present invention to actualize a reduction in the number of visual sensitivity correction filters of an optical system.

To accomplish the above objectives, the present invention's solid-state imaging apparatus comprises an AF photoelectric converting element for performing auto-focusing, and an AE photoelectric converting element for executing a photometric process of a photographing region, the AF photoelectric converting element and the AE photoelectric converting element being integrated on a same semiconductor substrate, wherein a spectral-sensitivity characteristic of the AF photoelectric converting element is different from a spectral sensitivity characteristic of said AE photoelectric converting element.

Further, in the present invention's apparatus, it is desirable that a peak wavelength of the spectral sensitivity characteristic of the AE photoelectric converting element (AE sensor) is in the vicinity of 500 nm, while a peak wavelength of the spectral sensitivity characteristic of the AF photoelectric converting element (AF sensor) is 650 to 700 nm a sensitivity sufficient for a near infrared-ray region be provided. In this case, the spectral sensitivity characteristic of the AE sensor becomes similar to a human visual sensitivity characteristic, and besides the infrared sensitivity can be decreased. It is therefore possible to reduce a photometric error due to the color temperatures, and the visual sensitivity correction filters become unnecessary. Moreover, the peak wavelength of the spectral sensitivity characteristic of the AF sensor is widened to the near infrared region, whereby an AF operable range can be expanded owing to the enhanced sensitivity of the AF sensor and the auxiliary light.

DESCRIPTION OF THE PREFERRED EMBODIMENTS

Embodiments of the present invention will hereinafter be described in detail with reference to the accompanying drawings.

Embodiment 1

Figure 1:
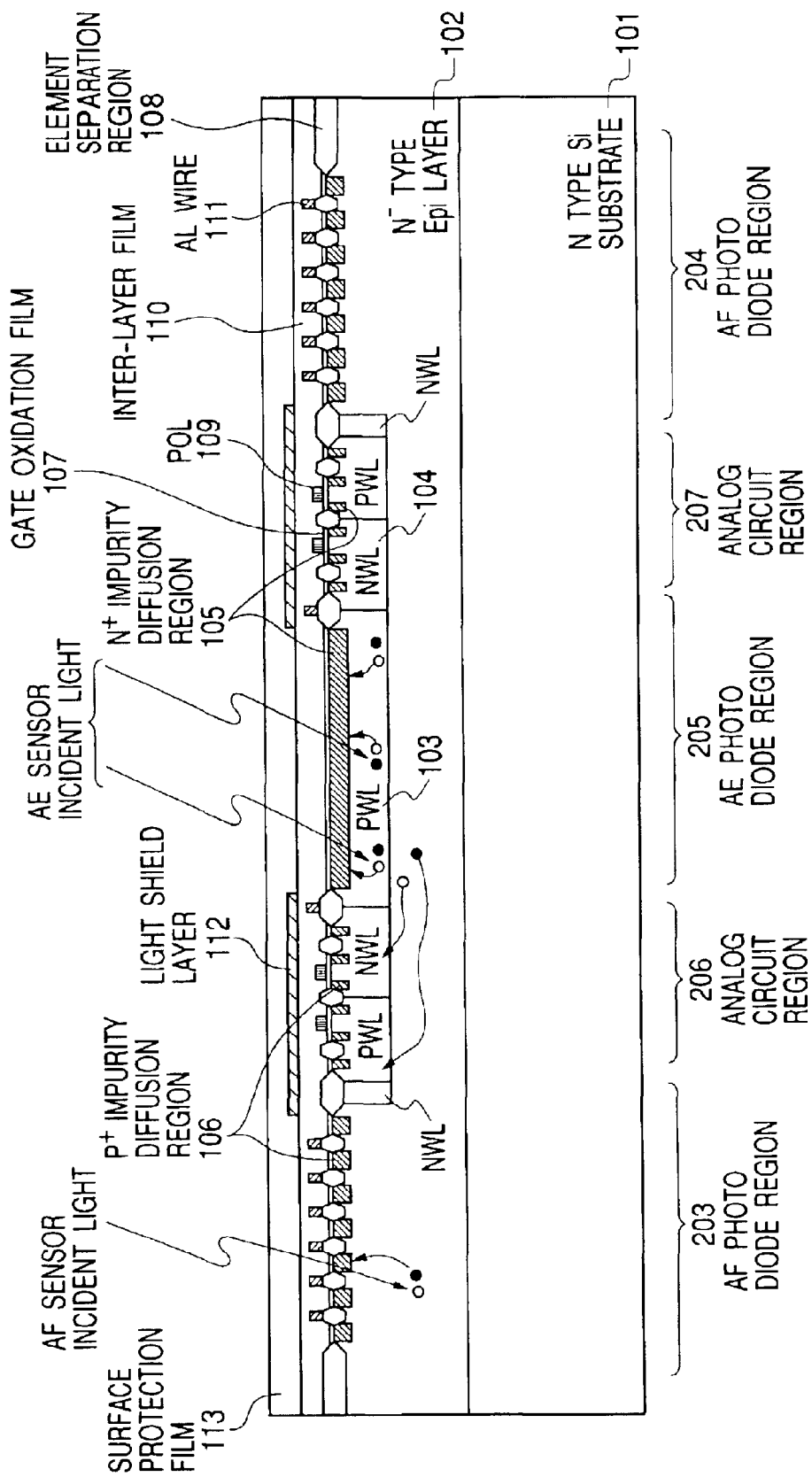
FIG. 1 is a sectional view of a structure in a first embodiment of the present invention.
Figure 2:
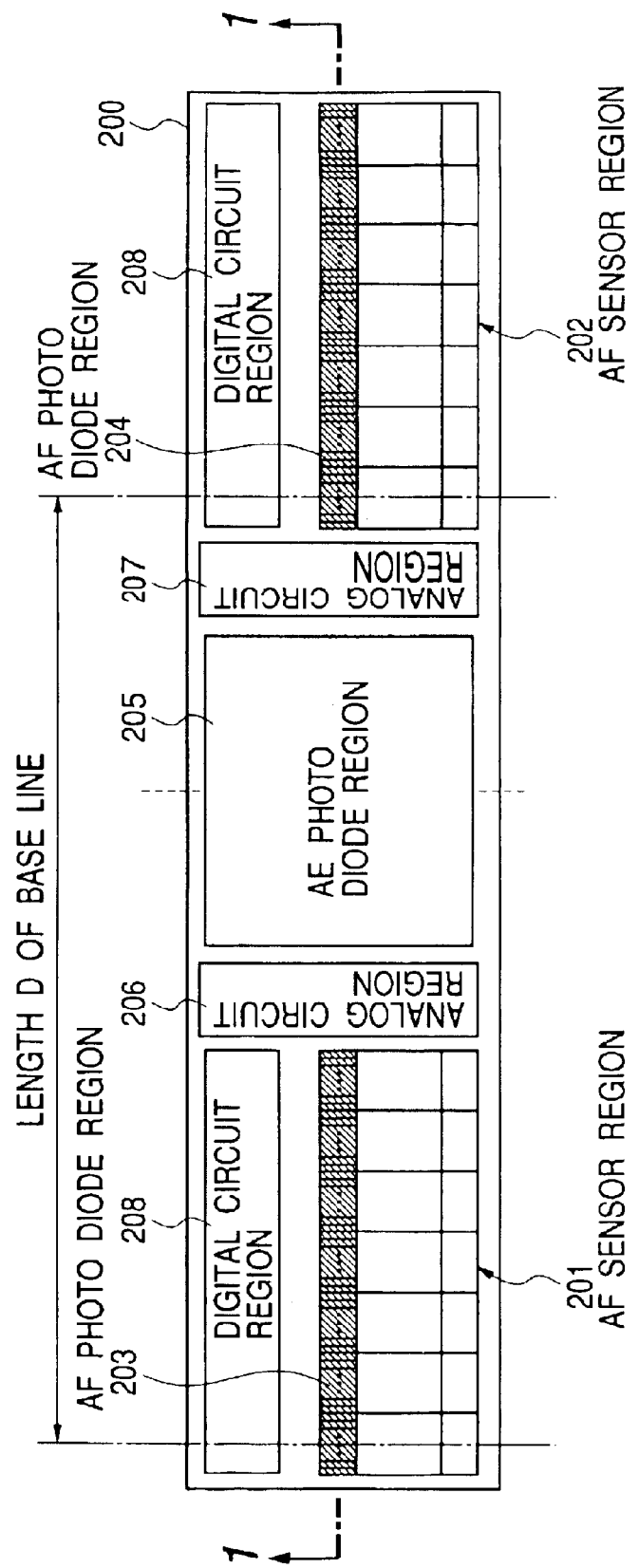
FIG. 2 is a view showing a plane layout in the first embodiment of the present invention.

FIG. 1 is a view illustrating features of the present invention most and schematically showing a sectional structure of a solid-state imaging apparatus of the present invention. Further, FIG. 2 is a view schematically showing a plane layout of the solid-state imaging apparatus according to the present invention. FIG. 1 is the sectional taken along the line 1—1 in FIG. 2. The embodiment 1 will exemplify a solid-state imaging apparatus manufactured by a CMOS (Complementary Metal-Oxide Semiconductor) process in a twin-well structure of a P type well (PWL) and an N type well (NWL) using an $N^-$ type epitaxial wafer.

Referring to FIG. 1 there are shown an N-type Si substrate 101, an N type epitaxial layer 102, a P type well (PWL) 103, an N type well (NWL) 104, an $N^+$ type impurity diffusion region (NSD) 105, a $P^+$ impurity diffusion region (PSD) 106, a gate oxide film 107, a thick selective oxide film 108 defined as an element separation region, a POL (polysilicon) wire 109 serving as a gate of a MOS transistor, an inter-layer insulation film 110, an AL (aluminum) wire 111, an AL film 112 defined as a light shielding film, and an SiON film 113 as a surface protection film. The PWL 103 and the NSD 105 form a PN-junction photodiode in an AE photodiode region 205. The $N^-$ type epitaxial layer 102 and the PSD 106 form a PN-junction photodiode in AF photodiode regions 203 and 204. Further, within analog circuit regions 206 and 207, a MOS type transistor is constructed of the PWL, the NWL, the $N^+$ type impurity diffusion region, the $P^+$ type impurity diffusion region and the POL (polysilicon) wire 109.

Referring to FIG. 2, the numeral 200 represents a Si semiconductor substrate (corresponding to the N type Si substrate 101 in FIG. 1), the numerals 201 and 202 designate AF sensor regions, 203 and 204 denote AF sensor photodiode regions, 205 stands for an AE photodiode region, 206 and 207 indicate analog circuit regions, and 208 represents a digital circuit region. Each of the AF sensor regions 201, 202 is constructed of seven pieces of AF sensor blocks in order to perform 7-point ranging operations. Each of the AF sensor blocks of the AF sensor regions 201, 202 is a CMOS linear type AF sensor circuit including the AF sensor photodiode regions 203, 204. The CMOS linear type AF sensor circuit is disclosed in, e.g., Japanese Patent Application Laid-Open No. 2000-180706.

According to the embodiment 1, the photodiode of the AF sensor is formed in the $N^-$ type epitaxial layer 102, and the photodiode of the AE sensor is formed in the P type well 103. A design in the embodiment 1 is that a layer thickness of the epitaxial layer is on the order or 5 to 10 μm, and a depth of junction of the PWL is equal to or smaller than 1 μm. Therefore, the photodiode of the AF sensor is capable of collecting photo charges (electric charges generated by beams having a longer wavelength) from the semiconductor region deeper than by the photodiode of the AE sensor.

Further, it is preferable that the $N^-$ type epitaxial layer 102 be thinner in its concentration of the impurity than the P type well 103. To be specific, the concentration of the impurity of the N-type epitaxial layer 102 is on the order of $5 \times 10^{15}$ $cm^{-3}$, and the concentration of the impurity of the P type well 103 is on the order of $1 \times 10^{17}$ $cm^{-3}$. This setting of the impurity concentrations enables a depletion layer of the AF photodiode to widen downwards more than that of the AE photodiode, whereby a characteristic of spectral sensitivity can be improved on the side of a longer wavelength in the AF sensor.

Figure 3:
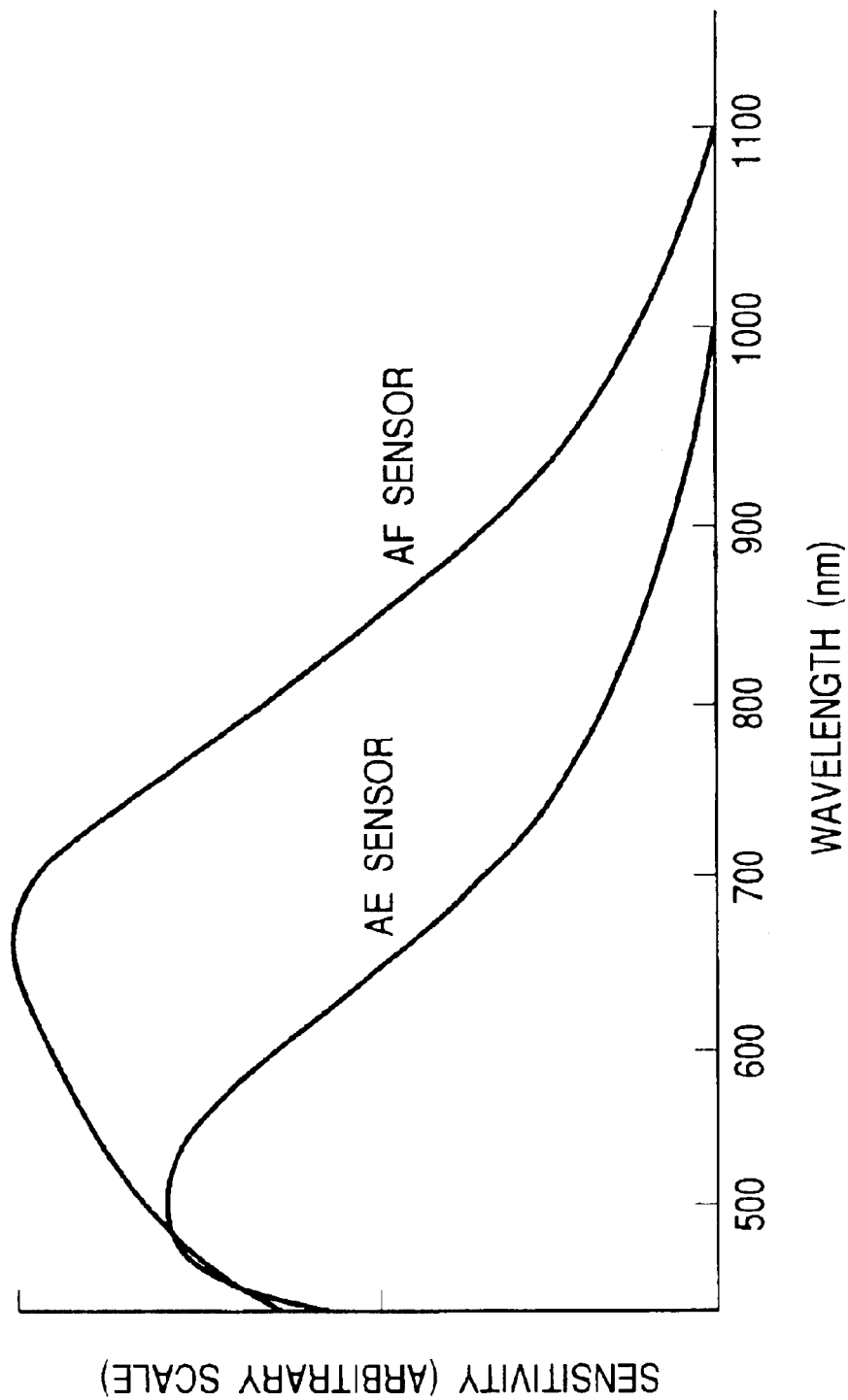
FIG. 3 is a graph showing characteristics of spectral sensitivities of an AE sensor and an AF sensor in the first embodiment of the present invention.

FIG. 3 shows the characteristics of spectral sensitivities of the AE sensor and of the AF sensor in the embodiment 1. The AF sensor is given a sensitivity that is sufficient enough to cover a near infrared region by setting a peak wavelength of the AF sensor to 650 through 700 nm, thereby making it possible to actualize an auxiliary light system utilizing the near infrared rays. Moreover, an infrared sensitivity can be decreased by setting a peak wavelength of the AE sensor to 500 nm, whereby the number of visual sensitivity correction filters (infrared cut filters) can be reduced.

According to the embodiment 1, it is feasible to actualize the photometric/ranging solid-state imaging apparatus in which the spectral sensitivity characteristics of the AE sensor and the AF sensor are optimized. The $N^-$ type epitaxial wafer has been explained in the embodiment 1, however, the same effect can be obtained by changing a polarity of the photodiode in a way that uses a $P^-$ type epitaxial wafer. Further, the present invention can be applied, without being limited to the CMOS sensor, to, for example, CCD (Charge Coupled Device), BASIS (Base-Stored Image Sensor), SIT (Static Induction Transistor), CMD (Charge Modulation Device), AMI (Amplified MOS imager) and so on.

Embodiment 2

Figure 4:
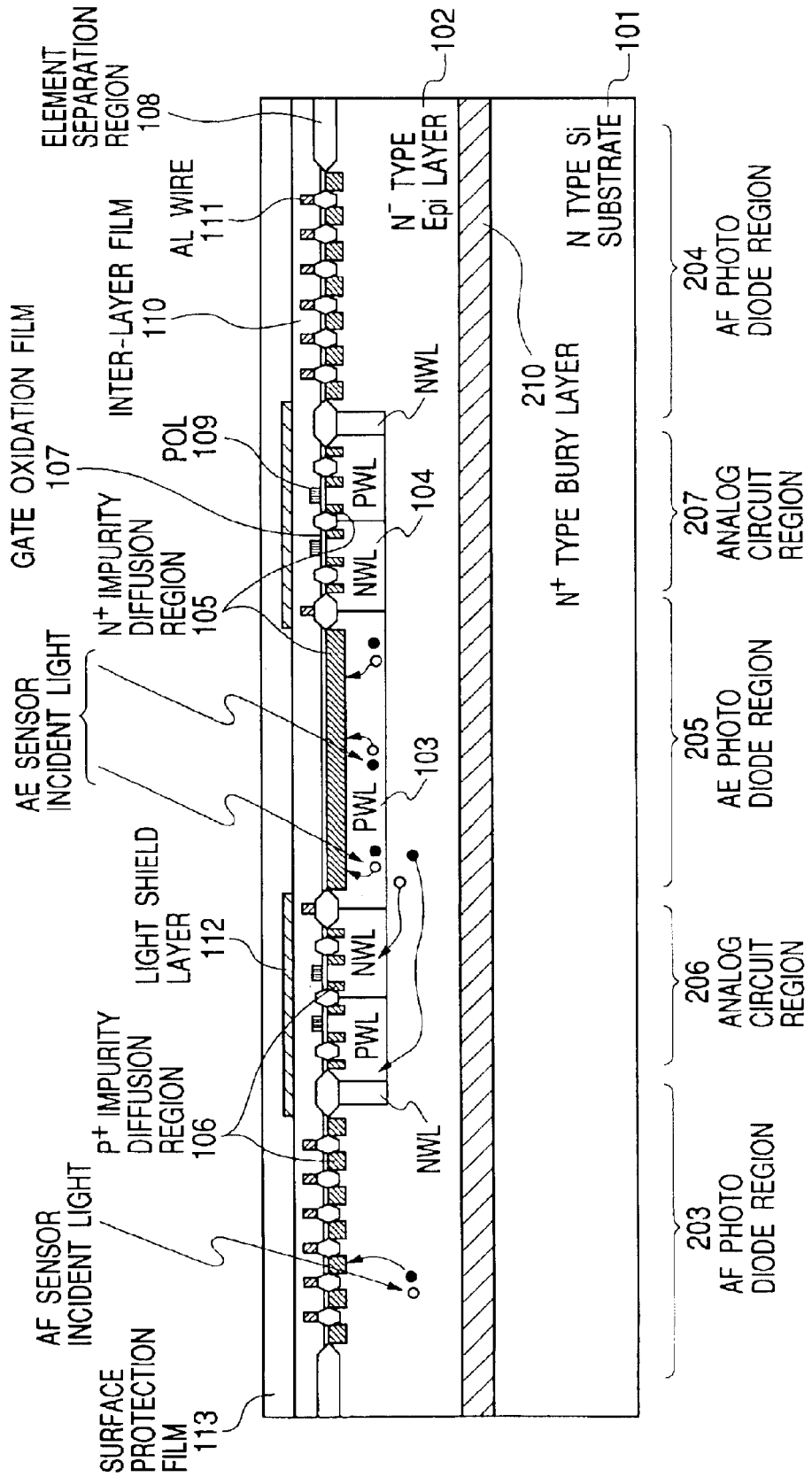
FIG. 4 is a sectional view of a structure in a second embodiment of the present invention.

FIG. 4 is a view showing a sectional structure of the solid-state imaging apparatus in which a second embodiment of the present invention is carried out. Referring to FIG. 4, the numeral 210 designates an N+ type impurity embedded layer (NBL). According to the embodiment 2, as compared with the first embodiment, the NBL 210 is provided between the N type Si substrate 101 and the N− type epitaxial layer 102, wherein a potential barrier by the NBL makes it possible to prevent a diffusion current coming from within the Si substrate 101 from flowing into the AF sensor photodiode. In particular, the AF sensor photodiode is formed in the epitaxial layer and is therefore largely influenced by the diffusion current coming from the Si substrate 101, and hence the embodiment 2 is highly effective. Moreover, a intrinsic gettering process is executed process-wise, whereby a dark current can be further reduced.

The embodiment 2 has come to actualization of the AE/AF solid state imaging apparatus of which the ranging performance is by far more improved than ever before because of the reduced dark current generated by the AF sensor photodiode.

Embodiment 3

Figure 5:
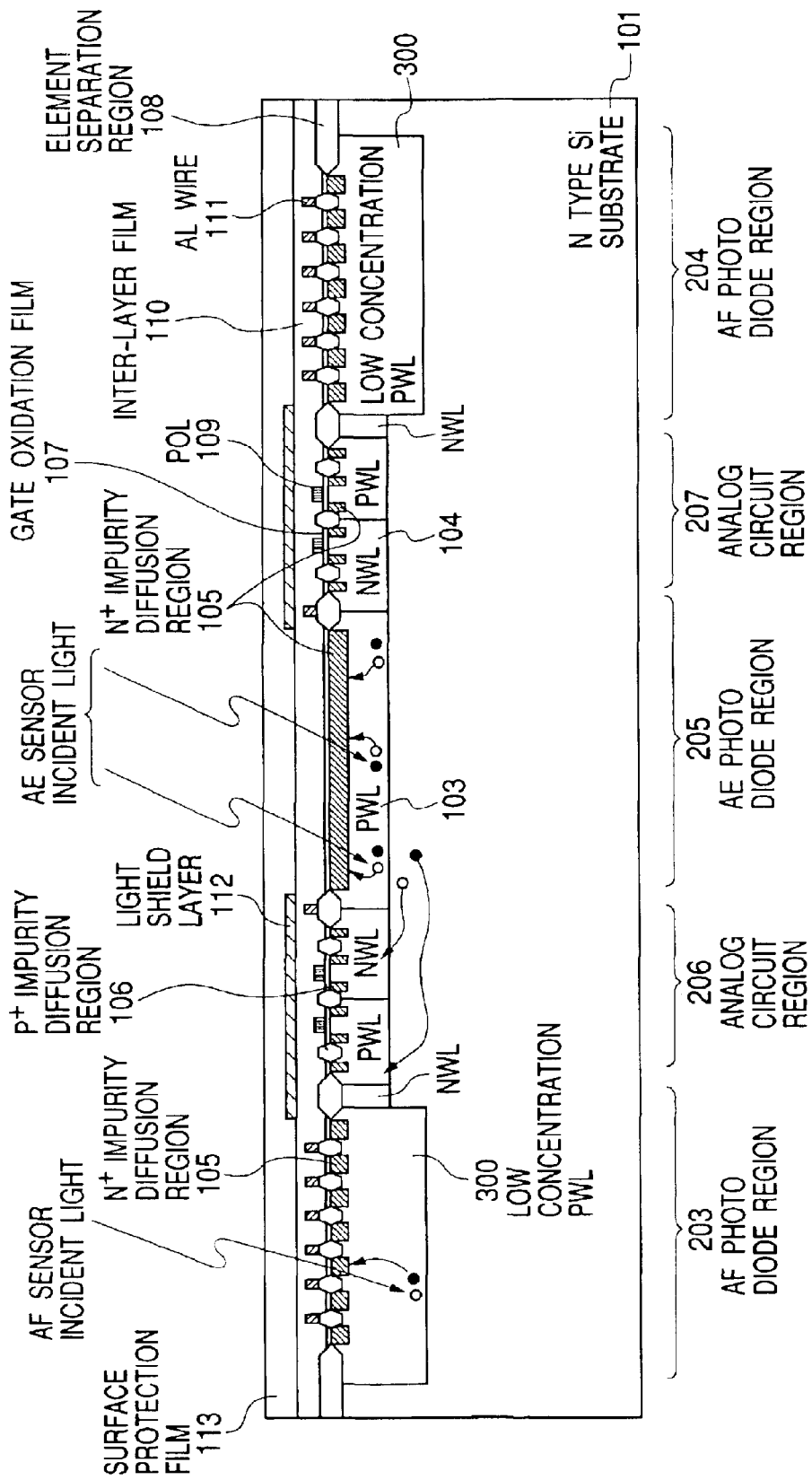
FIG. 5 is a sectional view of a structure in a third embodiment of the present invention.

FIG. 5 shows a diagram of a sectional structure of the solid-state imaging apparatus in which a third embodiment of the present invention is carried out. Referring to FIG. 5, the numeral 300 represents a low-concentration P type well. The AF sensor photodiode is provided in the epitaxial layer in the first embodiment and the second embodiment. According to the embodiment 3, the AF sensor photodiode is provided in the PWL 300 exhibiting a low concentration of impurity and a large depth of junction. The normal PWL 103 is on the order of $1 \times 10^{17}$ cm$^{-3}$ in its surface concentration and is equal to or smaller than 1 $\mu$m in its depth of junction. By contrast, the deep PWL 300 is formed so that the impurity concentration in the vicinity of the surface is on the order of $1 \times 10^{16}$ cm$^{-3}$, this impurity being implanted by a high-energy ion implantation apparatus, and the PWL junction depth is equal to or larger than 2 $\mu$m. Accordingly, the AF sensor photodiode is formed in the PWL as in the case of the AE sensor photodiode, and hence the epitaxial layer is basically unnecessary.

In the embodiment 3, the deletion layer of the AF sensor photodiode is widened towards the PWL side by thinning the impurity concentration of the PWL, thereby making it possible to improve the spectral sensitivity characteristic on the side of the long wavelength in the AF sensor. Moreover, the junction depth of the PWL is deepened, whereby the sensitivity on the side of the long wavelength can be further improved.

The embodiment 3 could come to the actualization of the AE/AF solid-state imaging apparatus I which the spectral sensitivity characteristic of the AF sensor is improved without using the epitaxial layer. The epitaxial layer is not required, and therefore a decrease in costs can be attained.

Fourth Embodiment

Figure 6:
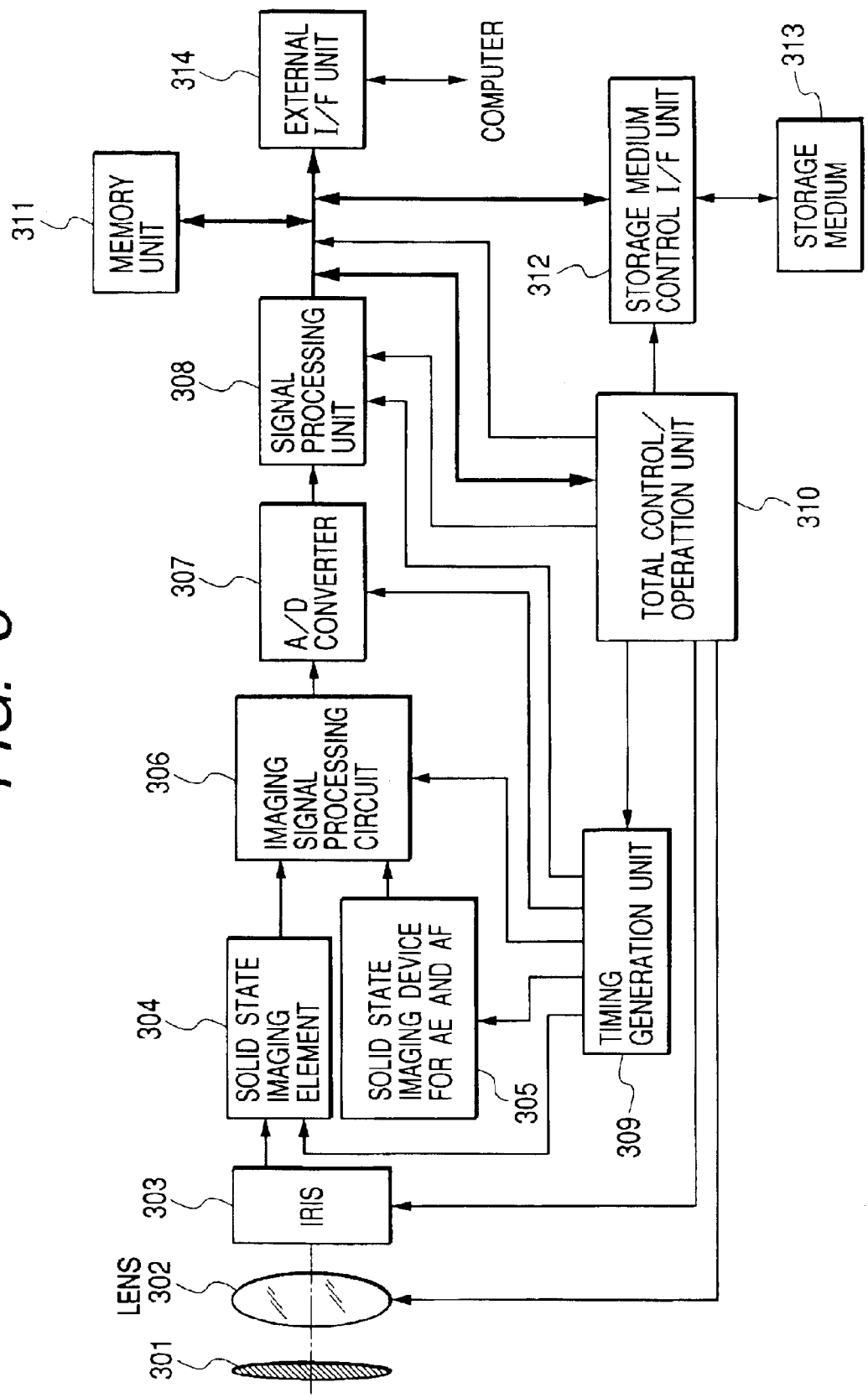
FIG. 6 is a block diagram showing one embodiment of an imaging apparatus utilizing an AE/AF solid-state imaging apparatus of the present invention.
Figure 7:
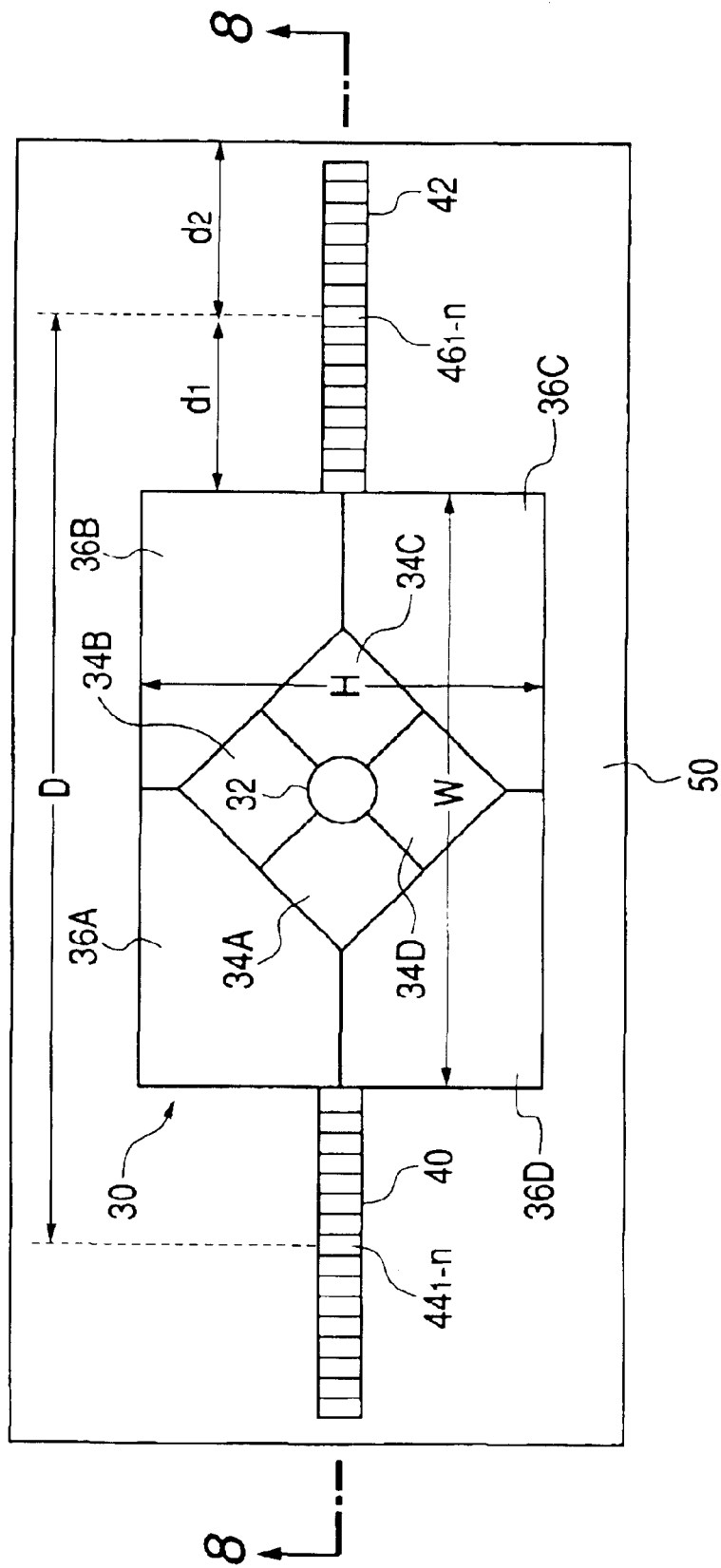
FIG. 7 is a view showing a plane layout of a conventional solid-state imaging apparatus.
Figure 8:
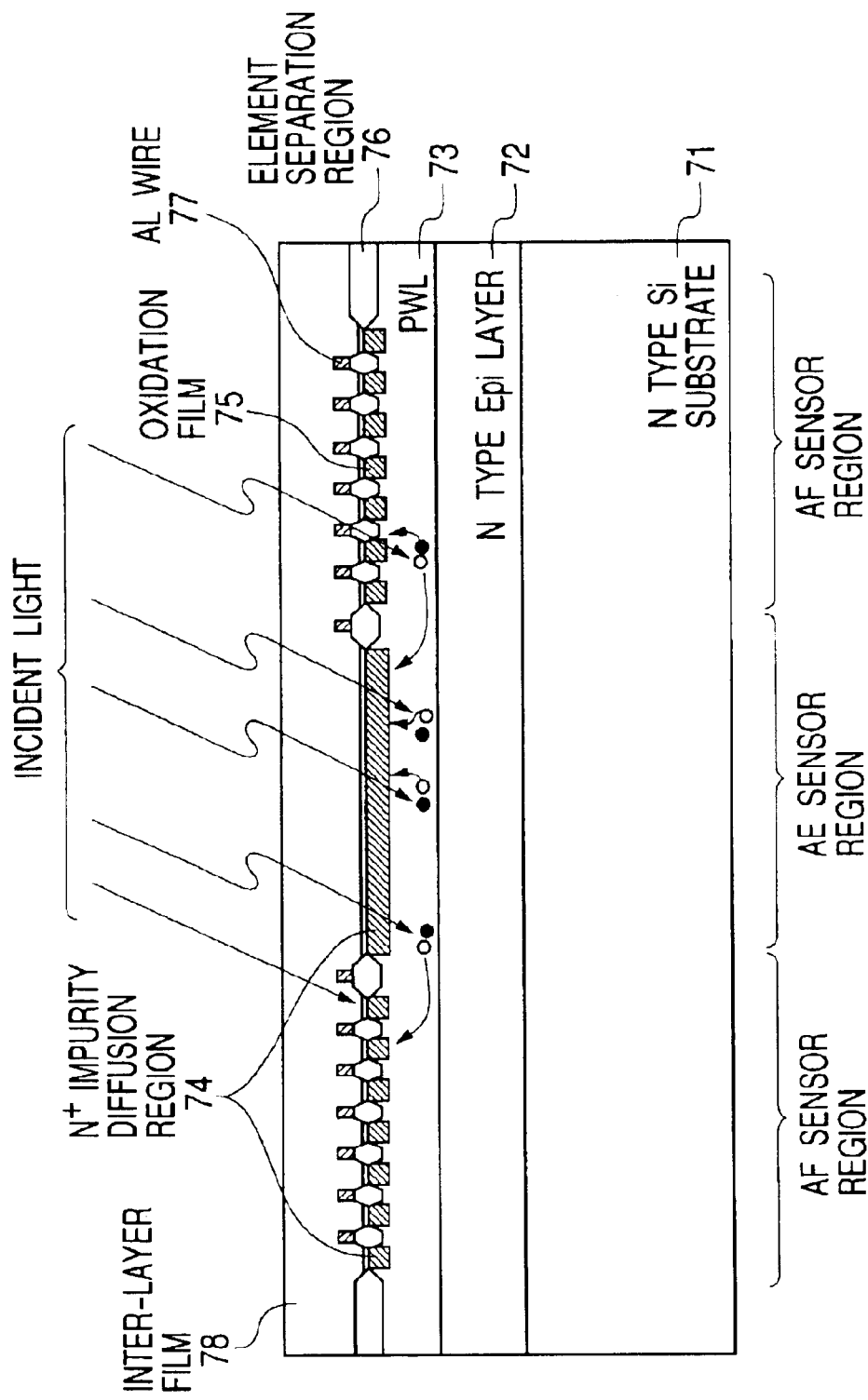
FIG. 8 is a sectional view showing a structure of the conventional solid-state imaging apparatus.

Next, an imaging apparatus utilizing the AE/AF solid-state imaging apparatus explained in each of the embodiments discussed above, will be described. FIG. 6 is a block diagram illustrating one embodiment in a case where the AE/AF solid-state imaging apparatus of the present invention is applied to a lens shutter digital compact camera. Referring to FIG. 6, there are shown a barrier 301 serving as a protection of the lens and as a main switch, a lens 302 for forming an optical image of an object on a solid-state imaging element 304, an iris diaphragm 303 for making variable an amount of light traveling through the lens 302, and a solid-state imaging element 304 for capturing an object image formed through the lens 302, as an image signal.

Further, the numeral 305 designates the AE/AF solid-state imaging apparatus described in each of the embodiments discussed above. For instance, what is employed herein is the AE/AF solid-state imaging apparatus exemplified in the embodiment shown in FIGS. 1 and 2. The numeral 306 stands for an imaging signal processing circuit for processing image signals, AF signals and AF signals outputted from the solid-state imaging element 304 and from the AE/AF solid-state imaging apparatus 305. The numeral 307 represents an A/D converter for executing an Analog-to-digital conversion of an output from the imaging signal processing circuit 306. The numeral 308 designates a signal processing unit for effecting a variety of corrections of the image data outputted from the A/D converter 307 and for compressing the data therefrom. The numeral 309 denotes a timing generation unit for outputting a variety of timing signals to the solid-state imaging element 304, the imaging signal processing circuit 306, the A/D converter 307, the signal processing unit 308 and so on. The numeral 310 represents a total control/operation unit for performing various arithmetic operations and controlling the whole of a camera. The numeral 311 designates a memory unit for temporarily storing (buffering) the image data.

Further, the numeral 312 denotes an interface unit through which the data are recorded on and read from a storage medium. The numeral 313 represents a detachable/attachable storage medium such as a semiconductor memory, etc. which the image data are recorded on and read from. The numeral 314 indicates an interface unit through which the apparatus communicates with an external computer, etc.

Next, an operation of the thus constructed lens shutter digital compact camera when photographing, will be explained. A main power source is switched ON when the barrier 301 is opened, subsequently a power source of the control system is switched ON, and further a power source of the imaging system circuit of the A/D converter 307, etc. is switched ON. Next, the total-control/operation unit 310 opens the iris diaphragm 303 in order to control an amount of exposure, and the signal outputted from the AE sensor of the AE/AF solid-state imaging element 305 is, after being converted by the A/D converter 307, inputted to the signal processing unit 308. The total control/operation unit 310 performs, based on the data thereof, an arithmetic operation of the exposure.

The total control/operation unit 310 judges a brightness on the basis of a result of executing this photometric process and adjusts, based on a result of this judgement, the iris diaphragm 303. Further, the total control/operation unit 310 performs the arithmetic operation of a distance to the object by detecting the phase difference described above on the basis of the signal outputted from the AF sensor of the photometric/ranging solid-state imaging apparatus 305. Thereafter, the lens 302 is moved, and it is judged whether the object focused or defocused. When judging that it is defocused, the ranging operation is conducted by moving again the lens 302, thus executing the auto-focusing control.

Subsequently, a final exposure starts after confirming that the object has been focused. Upon finishing the exposure, the image signal outputted from the solid-state imaging element 304 is A–D converted by the A/D converter 307, transmitted via the signal processing unit 308 and written to the memory unit 311 by the total control/operation unit 310. Thereafter, the data accumulated on the memory unit 311 are sent through the storage medium control I/F unit 312 under the control of the total control/operation unit 310, and stored on the detachable/attachable storage medium 313. Moreover, the data may be inputted direction to the computer, etc. via the external I/F unit 314.

As discussed above, according to the present invention, the solid-state imaging apparatus having the high photometric (AE) performance and the high ranging (AF) performance can be actualized by one chip, and the visual sensitivity correction filer of the AE optical system is not required systemwise. Therefore, the lens shutter compact camera utilizing the present solid-state imaging apparatus becomes a camera in which the more downsized configuration, the higher performances and the lower cost are all actualized.

The same effects of the present invention can be expected also in a compact digital camera without being limited to the compact analog (silver halide) camera.

What is claimed is:

1. A solid-state imaging apparatus comprising:

an AF photoelectric converting element; and an AE photoelectric converting element for executing a photometric process of a photographing region, which are integrated on a same semiconductor substrate, wherein a spectral sensitivity characteristic of said AF photoelectric converting element is different from a spectral sensitivity characteristic of said AE photoelectric converting element.

2. The solid-state imaging apparatus according to claim 1, wherein a peak wavelength of the spectral sensitivity characteristic of said AF photoelectric converting element is longer than a peak wavelength of the spectral sensitivity characteristic of said AE photoelectric converting element.

3. The solid-state imaging apparatus according to claim 1, wherein a peak wavelength of the spectral sensitivity characteristic of said AE photoelectric converting element is in the vicinity of 500 nm, and a peak wavelength of the spectral sensitivity characteristic of said AF photoelectric converting element is equal to or larger than 650 nm.

4. The solid-state imaging apparatus according to claim 1, wherein said AF photoelectric converting element and said AE photoelectric converting element are formed in well regions having impurity concentrations different from each other.

5. The solid-state imaging apparatus according to claim 4, wherein the impurity concentration of the well region where said AF photoelectric converting element is formed, is thinner than the impurity concentration of the well region where said AE photoelectric converting element is formed.

6. The solid-state imaging apparatus according to claim 5, wherein a conductivity of the impurity of the well region where said AF photoelectric converting element is formed, is the same as a conductivity of the impurity of the well region where said AE photoelectric converting element is formed.

7. The solid-state imaging apparatus according to claim 1, wherein the region formed with a photodiode defined as said AF photoelectric converting element and the region formed with a photodiode defined as said AE photoelectric converting element, are different from each other in their depths in a light incident direction.

8. The solid-state imaging apparatus according to claim 7, wherein the depth of the region formed with said photodiode as said AF photoelectric converting element, is deeper than the depth of the region formed with said photodiode as said AE photoelectric converting element.

9. The solid-state imaging apparatus according to claim 1, wherein said AF photoelectric converting element is provided in an epitaxial layer, and wherein said AE photoelectric converting element is provided in a well having an opposite conductivity type that is provided within said epitaxial layer.

10. The solid-state imaging apparatus according to claim 9, wherein said epitaxial layer is thinner in its impurity concentration than said well.

11. A camera comprising:

said solid-state imaging apparatus according to claim 1;

a detection region for detecting an image of an object;

a lens for forming an image of the light on said detection region; and a signal processing circuit for performing AF control and AE control on the basis of signals transmitted from said solid-state imaging apparatus.

* * * * *

UNITED STATES PATENT AND TRADEMARK OFFICE
CERTIFICATE OF CORRECTION

PATENT NO. : 6,803,614 B2
DATED : October 12, 2004
INVENTOR(S) : Hidekazu Takahashi It is certified that error appears in the above-identified patent and that said Letters Patent is hereby corrected as shown below:

Title page,
Item [57], ABSTRACT,
Line 6, "An" should read -- an --.

Drawings,
Sheet 6, Figure 6, item 310, "OPERATTION" should read -- OPERATION --.

Column 1,
Line 53, "sown" should read -- shown --.

Column 5,
Line 12, "a intrinsic" should read -- an intrinsic --.

Column 6,
Line 36, "total-control" should read -- total control --.

Column 7,
Line 5, "filer" should read -- filter --.

Signed and Sealed this

Twenty-second Day of February, 2005

JON W. DUDAS
*Director of the United States Patent and Trademark Office*